United States Patent [19]

Merlo

[11] Patent Number: 4,843,304

[45] Date of Patent: Jun. 27, 1989

[54] HIGH CAPACITY CURRENT MIRROR CIRCUIT

[75] Inventor: Mauro Merlo, Villasanta, Italy

[73] Assignee: SGS-Thomson Microelectronics S.r.l., Agrate Brianza

[21] Appl. No.: 52,606

[22] Filed: May 19, 1987

[30] Foreign Application Priority Data

May 20, 1986 [IT] Italy .................... 20493 A/86

[51] Int. Cl.$^4$ .................................. G05F 3/20
[52] U.S. Cl. ............................... 323/316; 323/317
[58] Field of Search ............................... 323/316, 317

[56] References Cited

U.S. PATENT DOCUMENTS

| | | | |
|---|---|---|---|
| 3,914,683 | 10/1975 | van de Plassche | 323/316 |
| 4,327,320 | 4/1982 | Oguey et al. | 323/313 |
| 4,346,344 | 8/1982 | Blauschild | 323/313 |
| 4,446,419 | 5/1984 | van de Plassche et al. | 323/316 |
| 4,584,535 | 4/1986 | Seevinck | 323/316 X |

Primary Examiner—Bernard Roskoski
Assistant Examiner—Marc S. Hoff
Attorney, Agent, or Firm—Arnold, White & Durkee

[57] ABSTRACT

A high capacity current mirror circuit comprises an operational amplifier electrically connected with its input, on the one side, to both a reference current source and a power supply pole through a first resistor, and on the other side, to said power supply pole through a second, feedback resistor, said amplifier being connected with its output to the base of a transistor, thereby supplying a current which is a mirror image of the reference current. According to the invention, that transistor is of the npn type, and in one embodiment, the transistor is connected in a Darlington configuration at the output of the operational amplifier which is of the transconductance type.

4 Claims, 1 Drawing Sheet

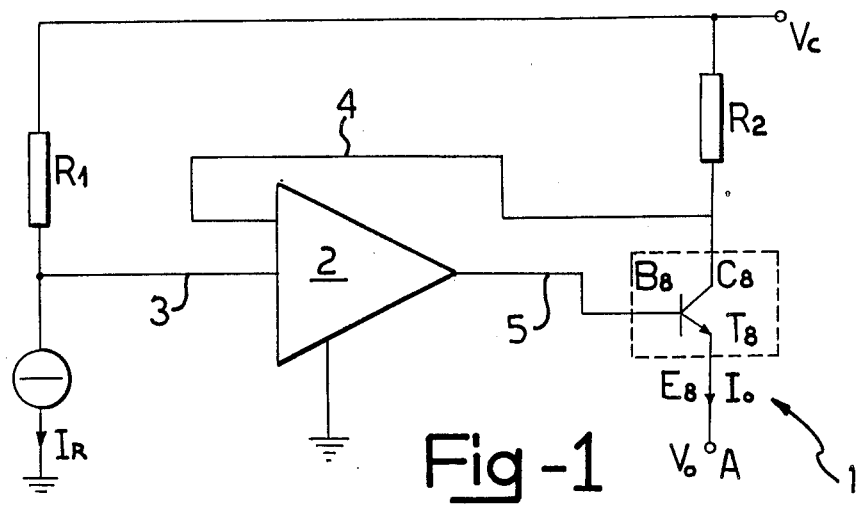
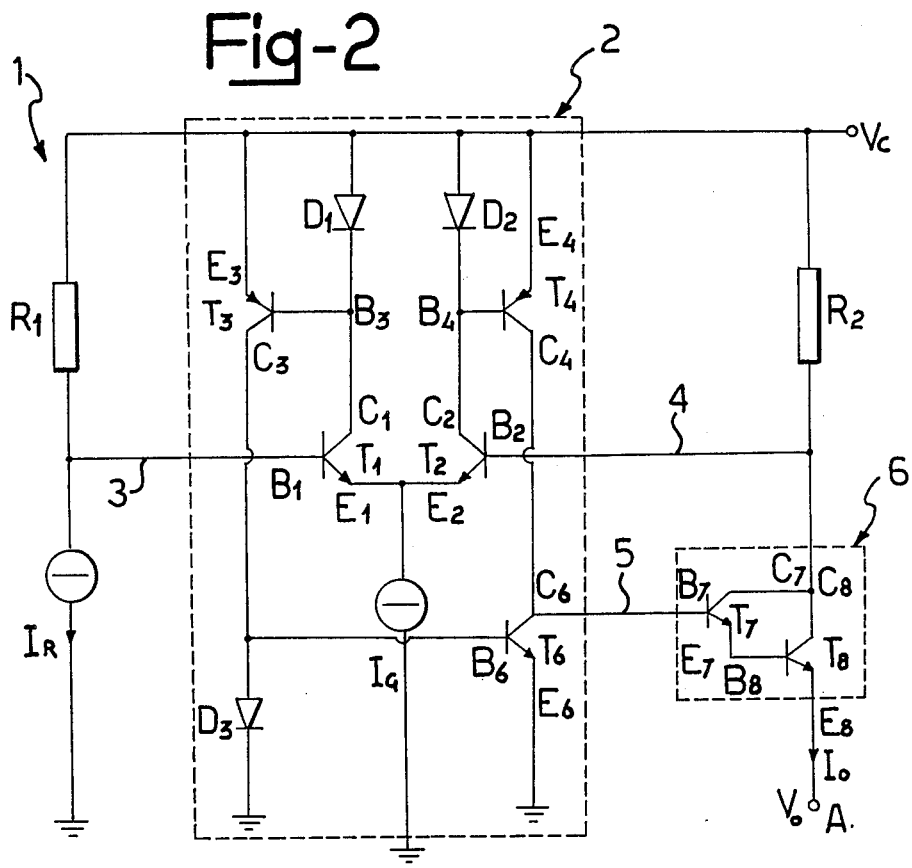

HIGH CAPACITY CURRENT MIRROR CIRCUIT

FIELD OF THE INVENTION

This invention relates to a high capacity current mirror circuit of a type which comprises an operational amplifier having one input connected to both a reference current source and a power supply pole through a first resistor, and having another input connected to said power supply pole through a second or feedback resistor, its output being connected to the base of a transistor, whereby it can supply a reflected current proportional to the reference current.

BACKGROUND OF THE INVENTION

A current mirror circuit is a circuit which enables transfer from one circuit leg to another of a current supplied, for example, by a reference current source.

Current mirror circuits have many applications in the field of integrated circuits, being particularly useful to bias differential circuits, in the oscillating circuit sector, and in sampling circuits of the sample-and-hold type.

Especially with sample-and-hold circuits, there exists a requirement for currents of large magnitudes, to discharge at a fast rate the capacitances which are typical of such circuits.

It has been proposed to employ, in an IC environment, conventional design current mirrors comprising transistors of the pnp type which occupy, within the integrated circuit itself, a surface area which is at least five times as large as that of a pnp transistor of minimum surface area. This expedient is dictated by the need to transfer high currents, in excess of 1 mA, but involves the serious drawback that a large silicon surface area must be reserved on the integrated circuit, at variance with the trend toward integrating an increasingly higher number of circuits per unit surface area.

A second expedient is that of integrating high capacity current mirrors, of the type comprising an operation amplifier having one input connected to both a reference current source and a power supply pole through a first resistor, and having another input connected to said power supply pole via a second, socalled "feedback", resistor; the amplifier has its output connected to the base of a transistor of the pnp type which supplies a reflected current $I_O$ proportional to the reference current $I_R$. The proportionality of the current to be transferred to the reference current will depend on the relation between the first resistance in the circuit and the feedback resistance, as well as directly on the $\alpha$ parameter of the pnp-type transistor which supplies the reflected current.

This second mirror type, while substantially achieving its objectives, has the disadvantage of involving a diminished $\alpha$ parameter of the pnp transistor and a consequent, not negligible error in the reflected current $I_O$.

SUMMARY OF THE INVENTION

The technical problem underlying this invention is that of providing a current mirror circuit which affords accuracy and reduced silicon surface area requirements on the integrated circuit, thus overcoming the above-mentioned shortcomings of comparable prior circuits.

This problem is solved by a high capacity current mirror circuit as indicated being characterized in that said transistor is of the npn type and has its collector connected to said pole via said feedback resistor Further features an the advantages of this invention will be apparent from the following description of an exemplary embodiment thereof, given by way of illustration and not of limitation with reference to the accompanying drawing figures.

BRIEF DESCRIPTION OF THE DRAWING

In the drawing:

FIG. 1 is a diagramatic view of a current mirror circuit according to the invention; and FIG. 2 is a more detailed diagramatic view of a current mirror circuit according to the invention in a preferred modification thereof.

DETAILED DESCRIPTION

With reference to the drawing figures, generally designated at 1 is a high capacity current mirror according to this invention.

Advantageously herein, the current mirror circuit 1 includes an operational amplifier circuit 2 of the differential cell transconductance type, which has a first input connected through a first electric connection 3 to both a reference current $I_R$ source and power supply pole $V_C$ through a first resistor R1. The amplifier 2 has a second input connected, via a second electric connection 4, to both said power supply pole $V_C$ via a feedback resistor R2, and to the collector C8 of a transistor T8 of the npn type which supplies, in accordance with this invention, a reflected current $I_O$ from its emitter E8 to a node A at a voltage of $V_O$.

An operational amplifier of the transconductance type is one which is controlled by voltage at its inputs to supply a required base current for the transistor T8. The transconductance of the amplifier is due to the ratio between the output current and the input voltage.

In on embodiment of the invention, the amplifier 2 has its output connected directly to the base B8 of said transistor T8 through an electric connection indicated at 5, as depicted in FIG. 1.

With particular reference to the example of FIG. 2, said amplifier 2 comprises a differential cell structure composed of a pair of transistors T1 and T2 of the npn type having their emitters E1 and E2 connected to each other and to ground through a current $I_G$ source. The bases B1 and B2 of said transistors T1 and T2 constitute the inputs of the amplifier 2, and connected thereto are the aforesaid electric connections 3 and 4, respectively.

The collectors C1 and C2 of the transistors T1 and T2 are respectively connected to the power supply $V_C$ through diodes D1 and D2 and to the base B3 of a transistor T3 and the base B4 of a transistor T4, respectively.

The transistor T3 is of the pnp type, and has its emitter E3 connected directly to the power supply $V_C$, while its collector C3 is grounded with the interposition of a diode D3.

The transistor T4 is also of the pnp type and has its emitter E4 connected directly to the power supply $V_C$, its collector C4 being connected to the collector C6 of a transistor T6 which is of the npn type and has its emitter E6 grounded and its base B6 connected to the collector C3 of said transistor T3.

The collector C6 of the transistor T6 constitutes the output of said amplifier 2, and said electric connection 5 extends therefrom.

Advantageously in a preferred embodiment of this invention, as shown in FIG. 2, the transistor T8 of the npn type, which supplies the reflected current $I_O$ from its emitter E8, is connected in a so-called Darlington configuration 6 through a second transistor T7 of the npn type. The transistor T7 in the conventional Darlington configuration 6 has respectively its emitter E7 connected directly to the base B8 of the transistor T8 and its collector C7 connected to the collector C8.

The transistor T7 in the Darlington arrangement 6 has its base B7 connected directly to the collector C6 of the transistor T6, at the amplifier 2 output, via the electric connection 5.

The reflected current $I_O$ is controlled by the transconductance operational amplifier stage which supplies the required base current for the transistor T8 of the npn type.

The high capacity current mirror circuit of this invention maintains a proportional relationship between the reflected current $I_O$ and reference current $I_R$, being defined by the ratio of the first resistor R1 to the feedback resistor R2. Accordingly, higher or lower reflected currents become obtainable by merely changing the ratio of said resistors R1 and R2.

In the preferred modified embodiment employing the Darlington arrangement 6 of the transistors T7 an T8, the aforesaid proportionality will also be dependent on that $\alpha$ parameter of the Darlington arrangement 6, which is, however, quite close to unity. Thus, $I_O = I_R \cdot (R1/R2) \cdot \alpha$.

The voltage across the resistor R1 should be no less than 300 mV, to avoid saturating (SAT) the transistor T1 forming a part of the transconductance operational amplifier stage. Despite this limitation, the dynamic range at the output of the inventive current mirror is, even where a Darlington arrangement is used, nearly identical to that of a conventional current mirror, on account of the voltage $V_O$ which appears at the terminal A being equal to the supply voltage $V_C$ less just 1.3 Volts. While the values of $V_C$, R1 and R2 are not important for the embodiment shown, the maximum voltage $V_O$ at the terminal A is due to the relationship $V_{O\ max} = V_C - V_1 - V_{CE/SAT} - V_{BE}$, where $V_1$ is the voltage drop across the resistor R1, $V_{CE/SAT}$ is the voltage drop across the collector/emitter junction of the transistor T1 and $V_{BE}$ is the voltage drop across the emitter junction of the transistor T8. $V_O$max will be equal to $V_C - 1.3$ volts when $V_1 = 300$ mV.

A first, self-evident advantage of this invention is that, in respect of the transistors in the integrated circuits, a transistor of the npn type, as integrated on a minimal surface area, operates, while retaining good characteristics, on a current which is about ten times as high as with a transistor of the pnp type occupying the same area of silicon. Thus, with high currents above 1 mA, the current mirror according to the invention will occupy a reduced silicon surface area in the integrated circuit, which is of high significance in economical terms.

Another advantage is that this high capacity current mirror circuit affords higher accuracy than conventional high capacity current mirror circuits.

I claim:

1. A high capacity current mirror circuit comprising: an operational amplifier, of the transconductance type, having one input connected to both a reference current source and a power supply pole through a first resistor, and having another input connected to said power supply pole through a second, feedback resistor, and having its output connected to the base of a first npn type transistor, thereby supplying a reflected current proportional to the reference current, the transistor having its collector connected to said power supply pole through said feedback resistor.

2. A current mirror circuit according to claim 1, further comprising a second npn type transistor connected to the first npn type transistor in a Darlington configuration, the base of the second transistor being connected to the output of the amplifier.

3. A high capacity current mirror circuit, comprising:
   a differential circuit of the transconductance type, the differential circuit having
      a first transistor having a collector coupled to a power supply pole, an emitter coupled, through a current source, to an electrical ground, and a base coupled, through a first resistor, to the power supply pole and coupled to a source of reference current;
      a second transistor having a collector coupled to the power supply pole, an emitter coupled, through the current source, to the electrical ground, and a base coupled, through a second resistor, to the power supply pole; and
      a third transistor having an emitter coupled to the power supply pole, a base coupled to the collector of the second transistor, and a collector; and
   an npn type transistor having a base coupled to the collector of the third transistor, a collector coupled, through the second resistor, to the power supply pole, and an emitter which supplies a reflected current proportional to the reference current.

4. A high capacity current mirror circuit, comprising:
   a differential circuit of the transconductance type, the differential circuit including
      a pair of transistors having collectors connected to a power supply pole and emitters connected to a current source, a first transistor of the pair having a base connected to the power supply pole through a first resistor and connected to a source of reference current, a second transistor of the pair having a base connected to the power supply pole through a second resistor; and
      a third transistor having an emitter connected to the power supply pole, a base connected to the collector of the second transistor, and a collector; and
   an npn type transistor having a base connected to the collector of the third transistor, a collector connected to the power supply pole through the second resistor, and an emitter which supplies a reflected current proportional to the reference current.

* * * * *